United States Patent [19]
Fukuta et al.

[11] Patent Number: 5,456,778
[45] Date of Patent: Oct. 10, 1995

[54] METHOD OF FABRICATING CERAMIC CIRCUIT SUBSTRATE

[75] Inventors: Junzo Fukuta; Masashi Fukaya; Hideaki Araki, all of Mi, Japan

[73] Assignee: Sumitomo Metal Ceramics Inc., Yamaguchi, Japan

[21] Appl. No.: 109,040

[22] Filed: Aug. 17, 1993

[30] Foreign Application Priority Data

Aug. 21, 1992 [JP] Japan .................. 4-245697
Oct. 9, 1992 [JP] Japan .................. 4-298095

[51] Int. Cl.$^6$ ............................. H05K 1/00
[52] U.S. Cl. ............... 156/89; 29/846; 29/848
[58] Field of Search .............. 156/629, 630, 156/631, 632, 633, 634, 901, 89; 29/846, 848

[56] References Cited

U.S. PATENT DOCUMENTS

| | | | |
|---|---|---|---|
| 3,953,562 | 4/1976 | Hait et al. | 264/63 |
| 4,624,896 | 11/1986 | Watanabe et al. | 156/89 X |
| 4,679,320 | 7/1987 | Imanaka et al. | 156/89 X |
| 4,753,694 | 6/1988 | Herron et al. | 156/89 |
| 4,795,512 | 1/1989 | Nakatani et al. | 156/89 |
| 4,879,156 | 11/1989 | Herron et al. | 428/137 |
| 5,085,720 | 2/1992 | Mikeska et al. | 156/89 |
| 5,130,067 | 7/1992 | Flaitz et al. | 156/89 X |
| 5,254,191 | 10/1993 | Mikeska et al. | 156/89 |
| 5,277,723 | 1/1994 | Kodama et al. | 156/89 |
| 5,290,375 | 3/1994 | Nagasaka et al. | 156/89 |

FOREIGN PATENT DOCUMENTS

| | | |
|---|---|---|
| 243858A2 | 11/1987 | European Pat. Off. . |
| 456243A2 | 11/1991 | European Pat. Off. . |
| 0479219A1 | 4/1992 | European Pat. Off. . |
| 0535711 | 4/1993 | European Pat. Off. . |
| 91/17840 | 11/1991 | WIPO . |

OTHER PUBLICATIONS

Patent Abstracts of Japan, vol. 15, No. 139 (E-1053), Apr. 9, 1991, JP-A-3 019 395, Jan. 28, 1991 & US 5,162,240.
Patent Abstracts of Japan, vol. 16, No. 415 (E-1257), Sep. 2, 1992, JP-A-41 39 894, May 13, 1992.
Patent Abstracts of Japan, vol. 15, No. 40 (E-1028), Jan. 30, 1991, JP-A-22 77 279, Nov. 13, 1990.
Patent Abstracts of Japan, vol. 13, No. 393 (E-814), Aug. 31, 1989, JP-A-11 38 792, May 31, 1989.
Japanese Publication No. 28867/1993.

*Primary Examiner*—Thi Dang
*Attorney, Agent, or Firm*—Oblon, Spivak, McClelland, Maier, & Neustadt

[57] ABSTRACT

A ceramic circuit substrate is fabricated by preparing ceramic greensheets for the fabrication of the ceramic circuit substrate, and unsintered ceramic sheets unsinterable at a sintering temperature of said ceramic greensheets, forming via holes in said ceramic greensheets and filling the via holes with via hole conductor paste, printing conductive patterns on the ceramic greensheets, stacking and laminating the ceramic greensheets to prepare a laminated body, placing said unsintered ceramic sheets on the uppermost layer and on the lowermost layer of the laminated body, bonding the sheets together by thermocompression to prepare a compressed body, firing the compressed body at the sintering temperature of ceramic greensheets, and removing the unsintered ceramic greensheets, wherein said via hole conductors are only in connection with the conductive patterns at the upper and/or lower ends of each via hole conductor.

10 Claims, 9 Drawing Sheets

METHOD OF FABRICATING CERAMIC CIRCUIT SUBSTRATE

BACKGROUND OF THE INVENTION

1. Field of the Invention

The present invention relates to a method of fabricating a ceramic circuit substrate having via hole conductors which has excellent electrical connectivity.

2. Discussion of the Prior Art

Conventionally, ceramic circuit substrates are fabricated by printing conductive patterns on the ceramic greensheets, laminating the ceramic greensheets to form a laminating body and thermocompressing, then sintering them.

In the sintering process, the ceramic substrates, because of sintering the ceramic greensheets, shrink in three dimensions by 10 to 20% and, therefore, the ceramic substrates differ in dimensions and positional accuracy of the conductive patterns. This makes it difficult to place ICs and tip capacitors in position on the ceramic circuit substrate.

In an alternative method of fabrication, unsintered ceramic sheets which do not sinter at the sintering temperature of the ceramic greensheets are placed on the outermost layers of the ceramic greensheets. The unsintered ceramic sheets are bonded to the outermost layers by thermocompression. Then, the ceramic greensheets are sintered. In this method, shrinkage of the ceramic substrates in the planar directions is suppressed. The ceramic substrates shrink principally only in the direction of their thickness dimension. In this case, however, the via hole conductors filled into the via holes, which pass through the ceramic substrates, shrink, and consequently the connectivity of the conductors with the inner walls of the via holes deteriorates. More specifically, the ceramic substrates shrink in their thickness direction, but the conductor in the via holes contracts in three dimensions. For this reason, gaps are created between the conductor surfaces in the via holes and the inner walls of the via holes. Therefore, gaps may be formed between the conductors in the via holes and the conductive patterns on the internal layer circuits the patterns being connected with the conductors. As a result, electrical connection may be impaired.

Figure 14:
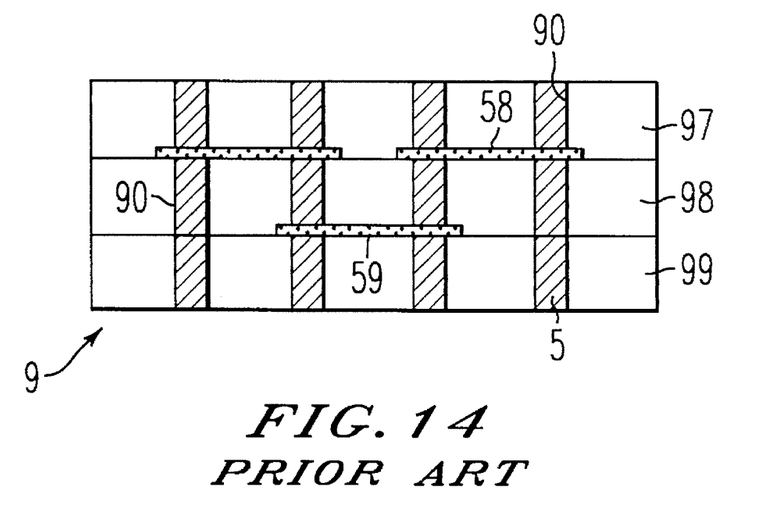
FIG. 14 is a cross-sectional view of a ceramic circuit substrate of the prior art.

As shown in FIG. 14, internal layer circuits 58 and 59 are formed inside the ceramic circuit substrate which is prepared by the above-described procedures. These internal layer circuits are electrically connected through via holes 90. Each of the via holes 90 has a via hole conductor 5 located therein. The internal layer circuits 58 and 59 are electrically connected together at the side surfaces of the via holes 90.

What we have mentioned above will be described more in detail by using FIG. 15. A method of fabricating the above-described ceramic circuit substrate 9 having internal layer circuits therein is as follows.

Figure 15:
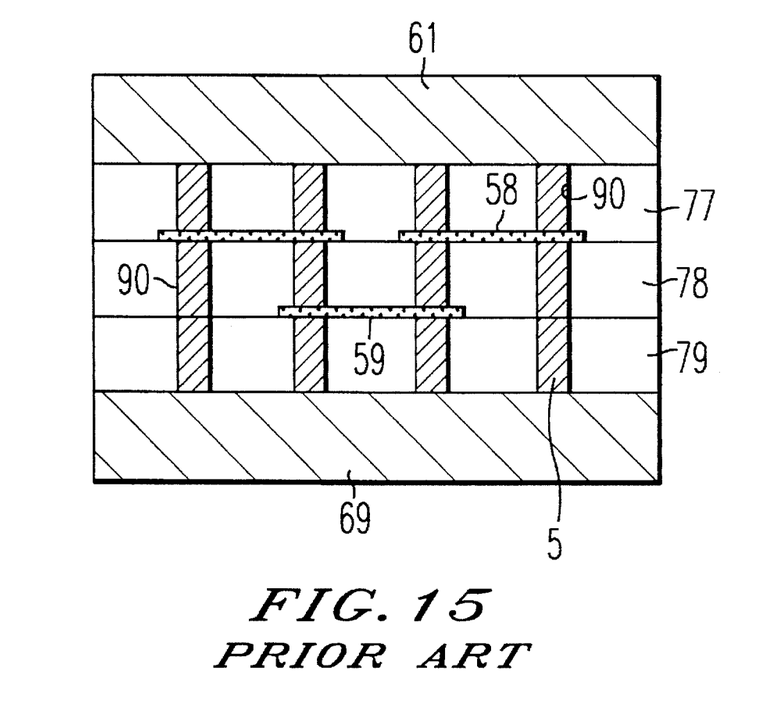
FIG. 15 is a diagram illustrating the manufacturing steps of a method of fabricating the ceramic circuit substrate.

First, as shown in FIG. 15, the via holes 90 are punched in ceramic greensheets 77–79 in registration with each other, the ceramic greensheets being used for fabrication of the ceramic substrates 97–99. The via hole conductors 5 filled into the via holes 90. Thereafter, the internal layer circuits 58 and 59 are printed on the surface, respectively, of the ceramic greensheets 78 and 79. Subsequently, unsintered ceramic sheets 61 and 69, which are not capable of sintering at the temperature at which the ceramic greensheets 77–79 are already sintered, are placed on the top and bottom surfaces, respectively, of the ceramic greensheets 77-79 and bonded thereto by thermocompression. Then, these sheets are sintered at the above-described sintering temperature, thus producing the ceramic substrates 97–99. Then, the unsintered ceramic sheets 61 and 69 are removed.

Figure 16:
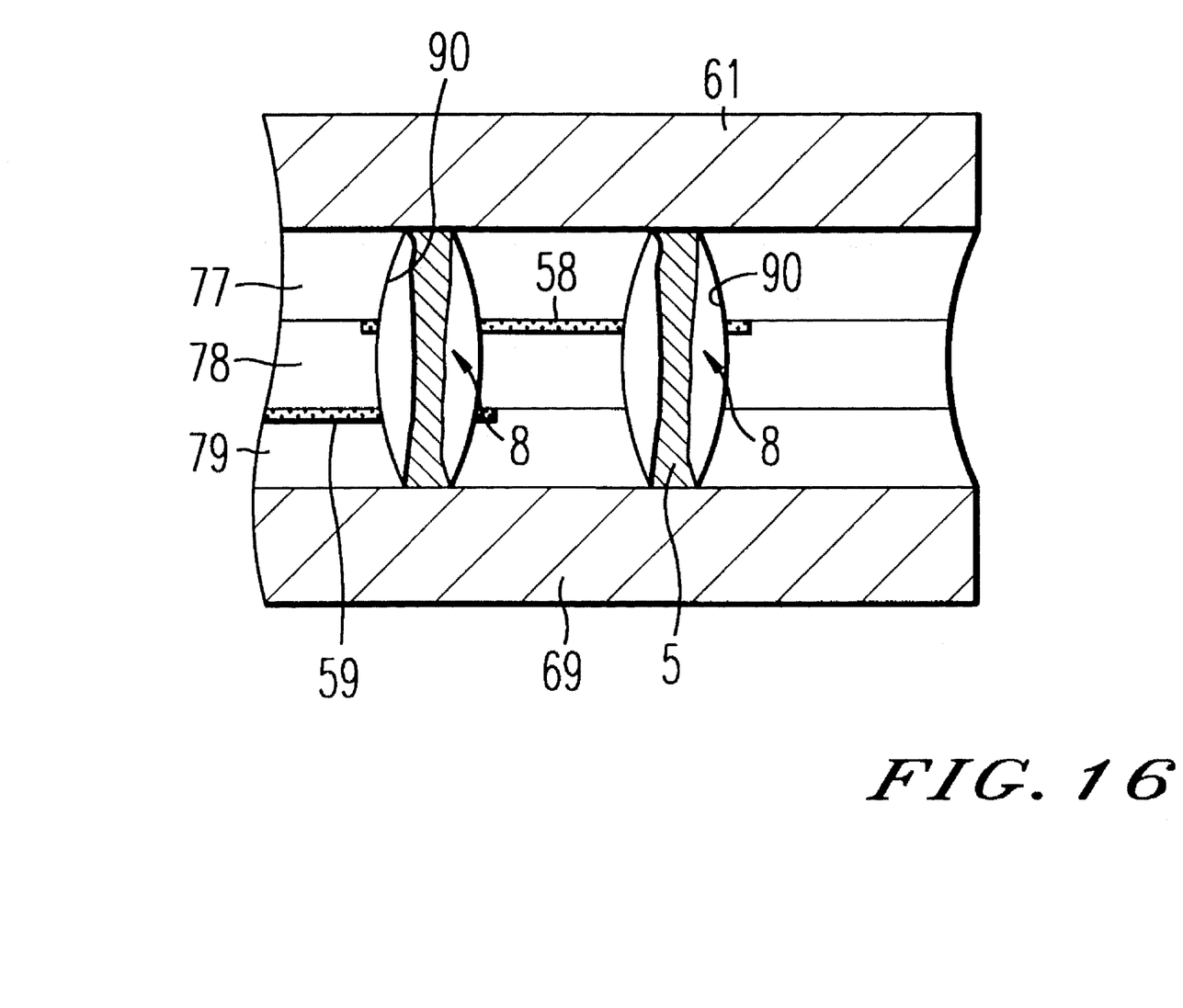
FIG. 16 illustrates the problems of the prior art.

In the above-described prior art method of fabrication, when the ceramic greensheets are sintered, via holes 90 curve as shown in FIG. 16, which results in gaps 8 in via holes 90. Therefore, via holes 90 and the internal layer circuits 58 and 59 may break. Hence, the prior art configuration lacks reliable electrical connections.

It is postulated that via holes 90 become curved for the following reasons.

During sintering, shown as in FIG. 16, the ceramic greensheets 77–79 shrink, since the top of the ceramic greensheet 77 and the bottom of the ceramic greensheet 79 are constrained by the unsintered ceramic sheets 61 and 69. Therefore, the ceramic greensheets 77–79 shrink in the vertical direction. However, the side surfaces of the ceramic greensheets are in a free condition. Consequently, the portions around the centers of the via holes 90 shrink to a significant extent and thereby curve and deform. The curvature and the deformation increase as the thickness of the entire compressed body of ceramic greensheets 77–79 increases. When the ceramic circuit substrate is used at locations where high temperatures alternate with low temperatures over a long period of time because of the cycles of thermal expansion and contraction of the via hole conductors and the ceramic substrates, breakage of connections might occur between the via holes and the internal layer circuits.

SUMMARY OF THE INVENTION

Accordingly, one object of the present invention is to provide a ceramic circuit substrate in which via holes are connected to internal layer circuits with a high degree of reliability.

Another object is to provide a method of fabricating a circuit substrate as described above.

Briefly, these objects and other objects of the invention as hereinafter will become more readily apparent can be attained by a method of fabricating a ceramic circuit substrate, by preparing ceramic greensheets for the fabrication of the ceramic circuit substrate, and unsintered ceramic sheets unsinterable at a sintering temperature of the ceramic greensheets, forming via holes in the ceramic greensheets and filling the via holes with via hole conductor paste, printing conductive patterns on the ceramic greensheets, stacking and laminating the ceramic greensheets to prepare a laminated body, placing the unsintered ceramic sheets on the uppermost layer and on the lowermost layer of the laminated body, bonding the sheets together by thermocompression to prepare a compressed body, firing the compressed body at the sintering temperature of the ceramic greensheets, and removing the unsintered ceramic greensheets, wherein the via hole conductors are only in connection with the conductive patterns at the upper and/or lower ends of the via hole conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

It is to be noted that in the invention as described, the via holes conductors connect with the internal layer circuits only at the ends of the via hole conductors. The via hole conductors are not in connection with the internal layer circuits at their side surfaces as in the prior art configuration. By ends is meant the upper ends or the lower ends of the via hole conductors or both upper and lower ends.

The via hole conductors can extend continuously through a plurality of ceramic substrates. Alternatively, the via holes may extend through only one ceramic substrate.

Where the via holes conductors extend continuously through three or more ceramic substrates, they are in connection with the internal layer circuits at the uppermost or lowermost ends.

The above-described ceramic substrates can consist of ceramic substrates which can be sintered at low temperatures below 1000° C., preferably at 800°–1000° C.

The internal layer circuits are buried in the ceramic circuit substrate.

The internal layer circuits are printed with a conductive paste, applying a conductive paste on the ceramic greensheet which form via holes filled with via hole conductors.

The unsintered ceramic sheets are made of alumina, zirconia, mullite, or the like.

It should be noted that when the ceramic greensheets are stacked and laminated, the internal layer circuits do not connect the side surfaces of the via hole conductors which extend through two or more of the ceramic greensheets. The internal layer circuits connect only with the ends of the via hole conductors, not at the side surfaces of the hole conductors.

Therefore, even if the via holes are curved by shrinkage of the ceramic greensheets during sintering, the electrical connection of the via hole conductors with the internal layer circuits is by no means hindered, because the internal layer circuits do not connect with the sides surfaces of the via hole conductors.

If the ceramic circuit substrate is used for a long time at locations where temperatures cycle from high temperatures to low-temperatures, neither the via hole conductors nor the internal layer circuits will break, unlike what happens with ceramic circuit substrates of the prior art configuration. Consequently, the present ceramic circuit substrate exhibits excellent reliability in terms of the manner in which the via hole conductors are connected with the internal layer circuits. The via hole conductor and internal layer circuits may be made of a conductive material selected from the group consisting of Ag, Pd—Ag, Pt—Ag, Au, and Cuo Further, the via hole conductive paste may consist of 100 parts by weight of Ag (silver) and 0.5 to 5 parts by weight of one or both of W (tungsten) and $Sb_2O_3$ (antimony oxide). By using this conductor paste, the connection between the via hole conductors and the surface of the inner walls of the via holes is so strong that a gap between them is not created. As a result, connections between the internal conductive patterns and via hole conductors are strengthened, and the resistivity of the above connections is lowered.

However, this effect can not be obtained, if one or both of W and $Sb_2O_3$ are present in less than 0.5 parts by weight per 100 parts by weight of Ag. Where the content of one or both of W and $Sb_2O_3$ is in excess of 5 parts by weight, the resistivity of the via hole conductors may become too high when conducting.

The via hole conductor pastes described above can contain 0.1 to 50 parts by weight of Pd (palladium) in addition to 100 parts by weight of Ag and 0.5 to 5 parts by weight of one or both of W and $Sb_2O_3$. Thus, the electrical connectivity of the via hole conductors with the conductive patterns on the inner and outer layers is improved, in the case of the conductive patterns of Pd—Ag. More specifically, Pd may be added to the conductive pattern (Ag) on the inner and outer layers to improve resistance to migration. In this case, the addition of Pd to the conductive components of the via hole conductors (Ag), improves the reliability with which the via hole conductors are bonded to the conductive patterns. If the content of Pd is less than 0.1 part by weight, the addition of Pd produces no effect. If the content of Pd exceeds 50 parts by weight, it is difficult to sinter the conductors.

A via hole conductor paste is obtained by mixing mixed powders of the composition described above, an organic binder such as ethylcellulose, and a solvent such as terpineol. During the mixing process, the aforementioned mixed powders are dispersed uniformly with three rolls or the like.

The mixed powders comprise a mixture of powdered Ag or mixed powders of Ag and Pd, along with powdered W or $Sb_2O_3$. The mixed powders of Ag and Pd can be a mixture of powdered Ag and powdered Pd, a co-precipitant of Ag and Pd, or a powdered alloy of both.

Preferably, the grain diameter of the above-described mixed powders lies in the range of from 0.1 to 20 μm. If the diameter is less than 0.1 μm or in excess of 20 μm, the grains are non-uniform diameters. This makes it difficult to form a uniform via hole conductor. Preferably, the average grain diameter is about 0.1 to 10 μm, for the same reason.

The ceramic greensheets described above can be sintered at low temperatures of 800° to 1000° C. A ceramic greensheet can be fabricated by mixing a ceramic powder, a binder, and a solvent, and shaping the mixture into the form of a sheet.

The aforementioned ceramic powder can be a mixture of a glass of the $CaO$—$Al_2O_3$—$SiO_2$—$B_2O_3$ system and α-alumina, a mixture of a glass of the $PbO$—$SiO_2$—$B_2O_3$ system and α-alumina or mullite, or a crystallized glass of the $MgO$—$Al_2O_3$—$SiO_2$—$B_2O_3$ system.

Preferably, the average grain diameter is approximately 0.1 to 10 μm.

Suitable binders described above include acrylic resin, butyral resin, or the like. Suitable solvents include benzene, ethanol, or the like.

The unsintered ceramic sheet can be obtained by mixing powders (such as α-alumina, zirconia, or the like which is sintered at a temperature above 1000° C.) in the same way as the ceramic greensheets described above and shaping the mixture into the form of a sheet.

In the novel fabrication method, the via hole conductors inside the via holes have the composition described above. Therefore, when the ceramic greensheets are sintered after bonding ceramic greensheets with the unsintered ceramic sheets by thermocompression, no gaps are created between the via hole conductors and the inner walls of the via holes. Consequently, the present ceramic circuit substrate exhibits excellent electrical connectivity inside the via hole conductors, and the electrical resistance of the conductor can be lowered. This excellent connectivity can be attributed to via hole conductors of the above-described composition which, as via hole conductors, bond to the ceramic substrates more firmly.

Having generally described this invention, a further understanding can be obtained by reference to certain specific examples which are provided herein for purposes of illustration only and are not intended to be limiting unless otherwise specified.

EXAMPLES

Example 1

Reference is here made to FIGS. 1–4.

Figure 1:
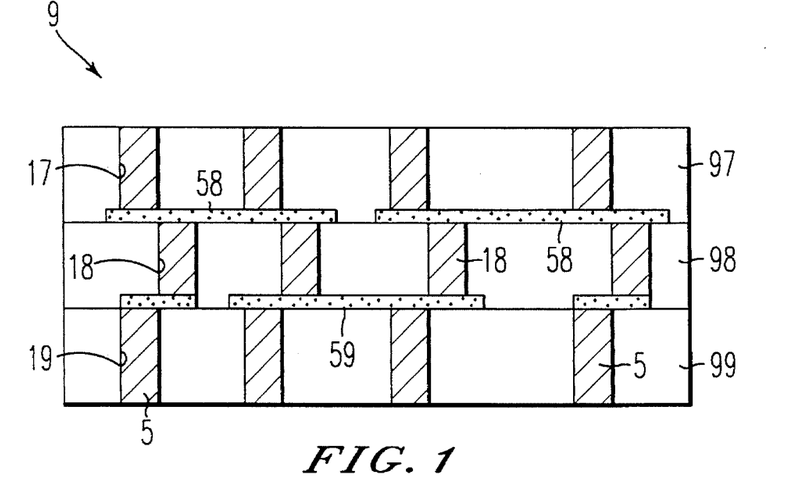
FIG. 1 is a cross-sectional view of the ceramic circuit substrate of Example 1.
Figure 2A:
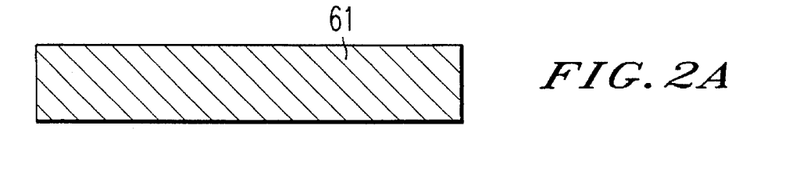
FIG. 2 is a diagram illustrating the manufacturing steps of a method of fabricating the ceramic circuit substrate of Example 1.
Figure 2B:
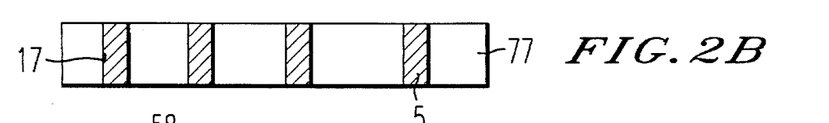
Figure 2C:
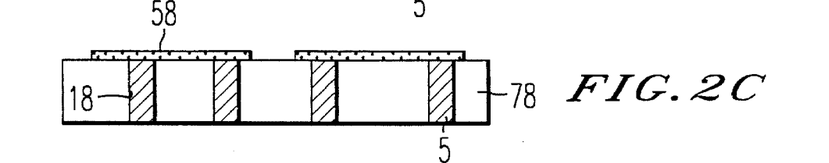
Figure 2D:
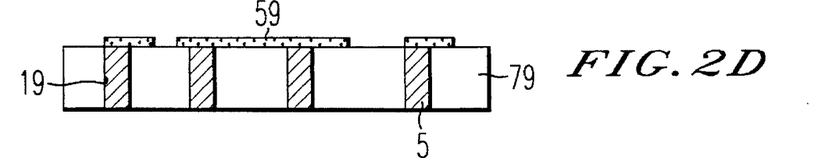
Figure 2E:
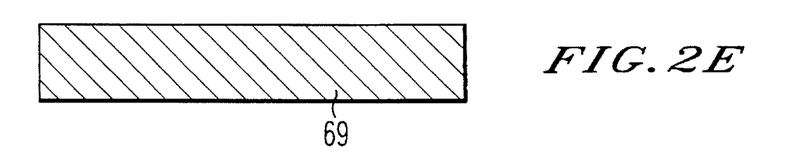

This example of ceramic circuit substrate 9 comprises stacked ceramic substrates 97–99 fired at low temperatures below 1000° C., as shown in FIG. 1. Internal layer circuits 58 and 59 are formed inside the ceramic circuit substrate 9. These circuits 58 and 59 are connected to the ends of the via hole conductors 5 in the holes 17–19. A via hole conductor 5 fills via holes 17–19.

Via holes 17–19 are formed in the ceramic substrate 97–99, respectively.

The internal layer circuits 58 are formed between via holes 17 and 18. The internal layer circuits 59 are formed between via holes 18 and 19. The via hole conductors 5 in the via holes 17–19 are interconnected by the internal layer circuits 58 and 59.

The ceramic substrates 97–99 have a thickness of 0.3 mm.

The via holes 17–19 have a diameter of 0.2 mm.

A method of fabricating the above-described ceramic circuit substrate is described next.

First, as shown in FIG. 2, ceramic greensheets 77–79 used for fabrication of the ceramic substrates 97–99 and unsintered ceramic sheets 61 and 69 are prepared. The unsintered ceramic sheets 61 and 69 do not sinter at the temperature at which the ceramic greensheets 77–79 are sinterable.

The ceramic greensheets 77–79 are made of a material used for fabrication of low-temperature-fired substrates which are sintered below 1000° C.

In fabricating the ceramic greensheets 77–79, a mixed powder forming a ceramic substrate material is prepared. This mixed powder consists of 60% by weight of a glass of the $CaO$—$Al_2O_3$—$SiO_2$—$B_2O_3$ system and 40% by weight of alumina. A solvent, an organic binder, and a plasticizer are added to the mixed powder. The mixture is kneaded to create a slurry.

Then, ceramic greensheets having a thickness of 0.5 mm are formed from the slurry by the normal doctor blade method.

In creating the unsintered ceramic sheets 61 and 69, an organic binder is added to powdered alumina to form a slurry. Then, unsintered ceramic sheets having a thickness of 0.5 mm are formed from the slurry by the normal doctor blade method.

The unsintered ceramic sheets 61 and 69 do not undergo deformation (e.g., expansion and shrinkage) by thermocompression and by sintering. When the unsintered ceramic sheets are placed on the above-described ceramic greensheets, evaporation of the binder contained in the ceramic greensheets is not hindered. The unsintered ceramic sheets 61 and 69 do not sinter at the temperature at which the ceramic greensheets are sintered.

Then, the via holes 17–19 are formed at alternating positions in the ceramic greensheets 77–79.

Subsequently, the via hole conductor 5 is filled into the via holes 17–19.

The via hole conductor 5 is obtained by adding an organic binder to a silver (Ag) conductor and then mixing these materials to the consistency of a paste. Then, the internal layer circuits 58 and 59 are printed on the ceramic greensheets 78 and 79. The internal layer circuits 58 and 59 are made of a conductive paste in which silver and a binder are mixed.

Figure 3:
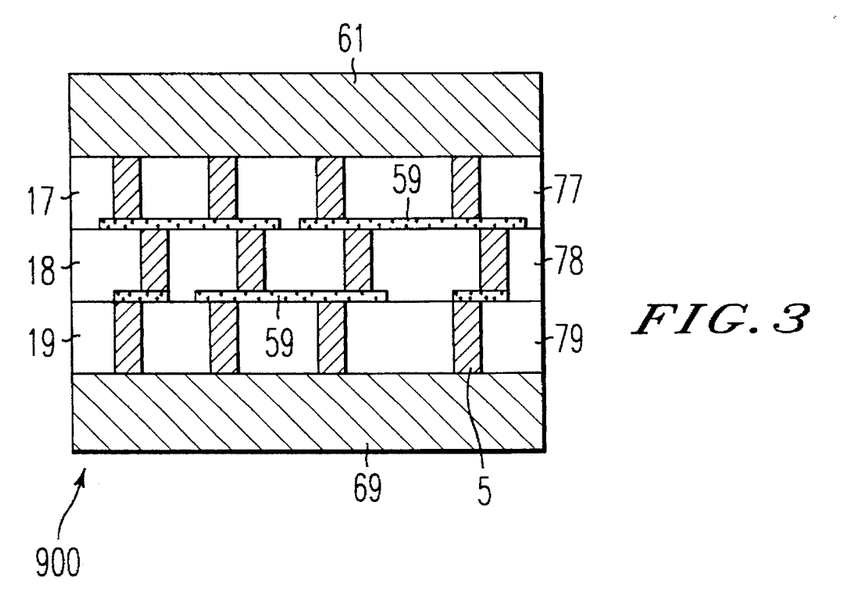
FIG. 3 is a diagram illustrating the manufacturing step subsequent to FIG. 2.

Then, as shown in FIG. 3, the unsintered ceramic sheet 69, the ceramic greensheets 79, 78, 77, and the unsintered ceramic sheet 61 are stacked and laminated successively from below in registration with each other. They are bonded together by thermocompression to prepare a compressed body 900. Thermocompression is effected at a temperature of 100° C. and at a force of 50 kg/cm² for 20 seconds.

Figure 4:
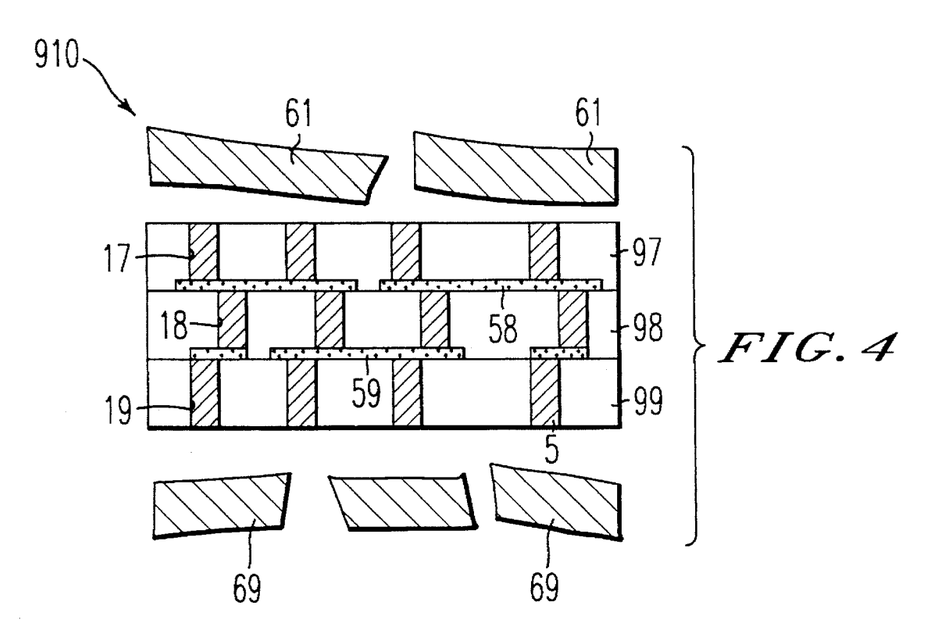
FIG. 4 is a diagram illustrating the manufacturing step subsequent to FIG. 3.

Then, the compressed body 900 is sintered at the temperature at which the ceramic greensheets are sintered, at a maximum temperature of 900° C. for 20 minutes. In this manner, as shown in FIG. 4, a fired body 910 comprised of the ceramic substrates 97–99 and having the above-described unsintered ceramic sheets 61 and 69 attached thereto is obtained. The unsintered ceramic sheets 61 and 69 are removed peeled from the fired body 910 with a brush. Furthermore, the unsintered ceramic sheets 61 and 69 remaining on the ceramic substrates are removed by ultrasonic cleaning. In this way, the ceramic circuit substrate 9 shown in FIG. 1 is obtained as described above.

The effects and the advantages of the present example are described next.

In the present example, the lower ends of the via hole conductor 5 in the via holes 17 are in connection with the internal layer circuit 58. The top and bottom ends of the via hole conductor 5 in the via holes 18 connect with the internal layer circuits 58 and 59. The top ends of the via hole conductor 5 in the via holes 19 connect with the internal layer circuits 59. The side surfaces of the via hole conductor 5 in the via holes 17–19 do not connect the internal layer circuits 58 and 59. Therefore, when the ceramic greensheets are sintered, even if via holes 17–19 are curved by shrinkage of the ceramic greensheets due to firing, the electrical connection of via holes conductors with the internal layer circuits 58 and 59 is not hindered at all, because the internal layer circuits 58 and 59 do not connect with the side surfaces of the via hole conductors 5. Furthermore, even if the ceramic circuit substrate is used over a long period of time at locations where high temperatures alternate with low temperatures, neither via hole conductors 5 nor the internal layer circuits 58–59 break, as in the above-described prior art example. Consequently, the present example of the ceramic circuit substrate 9 exhibits excellent reliability when the via hole conductors 5 are connected with the internal layer circuits.

Example 2

Figure 5:
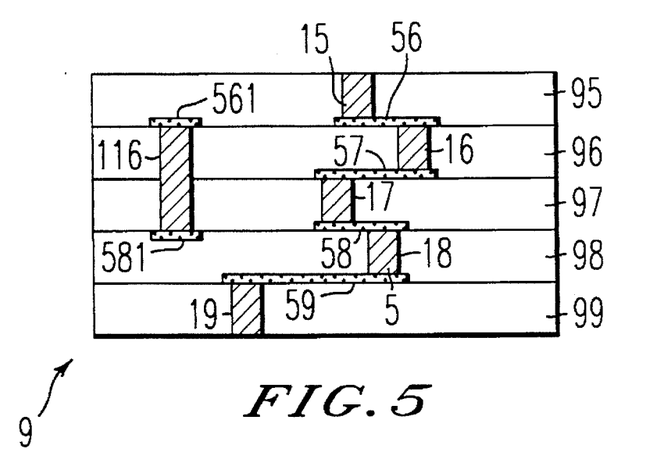
FIG. 5 is a cross-sectional view of the ceramic circuit substrate of Example 2.

The present example of ceramic circuit substrate 9 has the ceramic substrates 95–99 stacked, as shown in FIG. 5. The internal layer circuits 56–59, 561, 581 are formed inside the ceramic circuit substrate 9. These are in connection with the ends of the via hole conductors 5 in via holes 15–19, 116. It should be noted that via holes 116 are formed in the same positions throughout the ceramic substrates 96 and 97, and extend continuously through the two layers of the ceramic substrates. Via hole conductor 5 is filled into via holes 15–19, 116. Other than the above, this example is similar to Example 1.

In the present example, via holes 116 extend continuously through the two ceramic substrates 96 and 97. No internal layer circuits are connected to the side surfaces of the via hole conductor 5 in the via holes 116. Consequently, none of the breakage described above occurs therebetween. As a result, advantages similar to the advantages of Example 1 can be obtained.

Example 3

Figure 6:
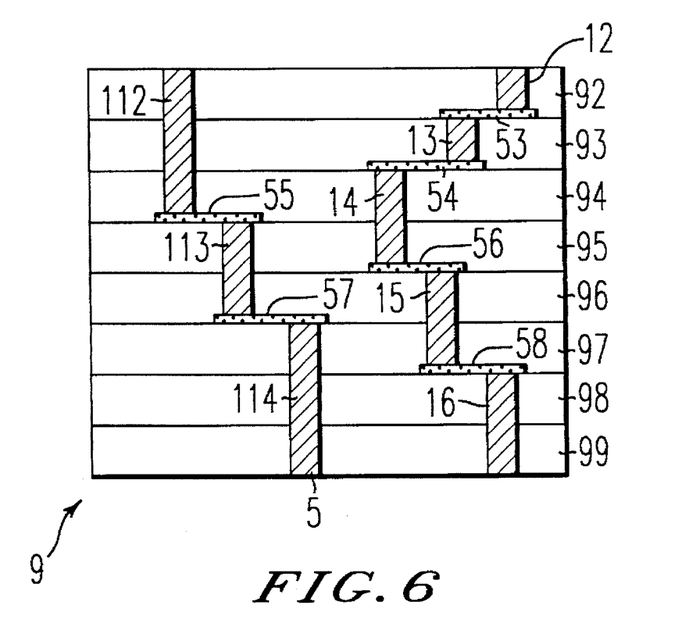
FIG. 6 is a cross-sectional view of the ceramic circuit substrate of Example 3.

This example of a ceramic circuit substrate 9 has ceramic substrates 92–99 stacked as shown in FIG. 6. Internal layer circuits 53–58 are formed inside the ceramic circuit substrate 9 and connect with the ends of the via hole conductors 5 in via holes 12–16, 112–114.

Via holes 14, 15, 16, and 113 extend continuously through two ceramic substrates.

Via holes 112 and 114 extend continuously through three ceramic substrates. Via holes 14–16 and 112–114, extend continuously through the substrates, in which via hole conductors 5 connect with the internal layer circuits only at their ends. Other than the above, this example is similar to Example 1.

This example yields advantages similar to the advantages of the ceramic substrate of Example 1.

Example 4

In this example, the breakage rate of via holes and conductor resistivity of ceramic circuit substrate as Samples 21–29 fabricated by the method of Examples 1 and 2 described above was measured.

Electrical resistance of via holes", is meant the total of the resistance of via hole conductor and the connective resistance between the internal layer circuit and the via hole conductor.

The number of measured holes was 10000.

Samples 21–27 are ceramic circuit substrates described in Example 1, only with different kinds of via hole conductors. Each via hole conductor of samples 21–27 is made of a paste selected from No. 6, 7, 1, 2, 3, 4, 5 as shown in Table 1.

Samples 28, 29 are ceramic circuit substrates described in Examples 2 and 3, with via hole conductors made of paste No. 6, 6.

Further, a ceramic circuit substrate with internal layer circuit on the side surfaces of via hole conductors was fabricated as Comparative Sample 30. (See FIG. 14).

Paste No. 6 was used as via hole conductor in Comparative Sample 30.

The above-described measurements show that the breakage rate of Samples 21–29 was 0% (0 for 10,000 via holes) and that the breakage rate of the comparative Sample 30 was 0.3% (30 for 10,000 via holes).

Electrical resistance of via hole conductors of Samples 23, 25, 26 is lower than that of Sample 21. The resistance of Sample 27 is lower than that of Sample 22. Also, the connectivity of the conductor of internal layer circuit and the via hole conductors is strengthened by the presence of W and $Sb_2O_3$ in the via hole conductor.

As can be seen from the above, a ceramic circuit substrate having excellent reliability with which the via holes conductors are connected with the internal layer circuits, can be fabricated by the present method of fabrication.

TABLE 1

| (Compositions of Ingredients of Pastes) (parts by weight) | | | | |
| --- | --- | --- | --- | --- |
| paste No. | Ag | Pd | W | $Sb_2O_3$ |
| 1 | 100 | 0 | 0 | 1.0 |
| 2 | 100 | 45 | 4.7 | 0 |
| 3 | 100 | 0 | 0.5 | 0.5 |
| 4 | 100 | 0 | 0 | 4.0 |
| 5 | 100 | 25 | 1.0 | 1.0 |
| 6 | 100 | 0 | 0 | 0 |
| 7 | 100 | 25 | 0 | 0 |

TABLE 2

| | (Results of Evaluation) | | |
| --- | --- | --- | --- |
| Samples | Paste No. | breakage rate of via hole (%) | resistance of via hole (mΩ/piece) |
| Example 1 | 21 | 6 | 0 | 0.52 |
| | 22 | 7 | 0 | 2.20 |
| | 23 | 1 | 0 | 0.43 |
| | 24 | 2 | 0 | 4.05 |
| | 25 | 3 | 0 | 0.43 |
| | 26 | 4 | 0 | 0.45 |
| | 27 | 5 | 0 | 2.01 |
| Example 2 | 28 | 6 | 0 | 0.51 |
| Example 3 | 29 | 6 | 0 | 0.51 |
| Comparative Sample | 30 | 6 | 0.3 | 0.64 |

Examples 5–8

Reference is made to FIGS. 7–12.

Figure 7:
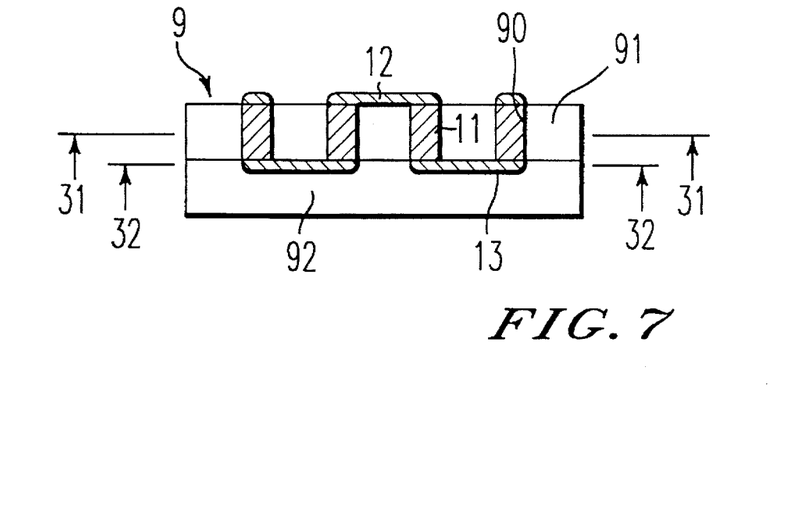
FIG. 7 is a cross-sectional view of the ceramic circuit substrate of any one of Examples 5–8 of the invention.

This example is a method of fabricating a ceramic circuit substrate 9 consisting of ceramic substrates 91 and 92 having via holes 90, each of which is filled with a via hole conductor 11, as shown in FIG. 7.

Conductive patterns 12 and 13 are printed on the upper surface and on the lower surface, respectively, of the ceramic substrate 91.

Figure 8:
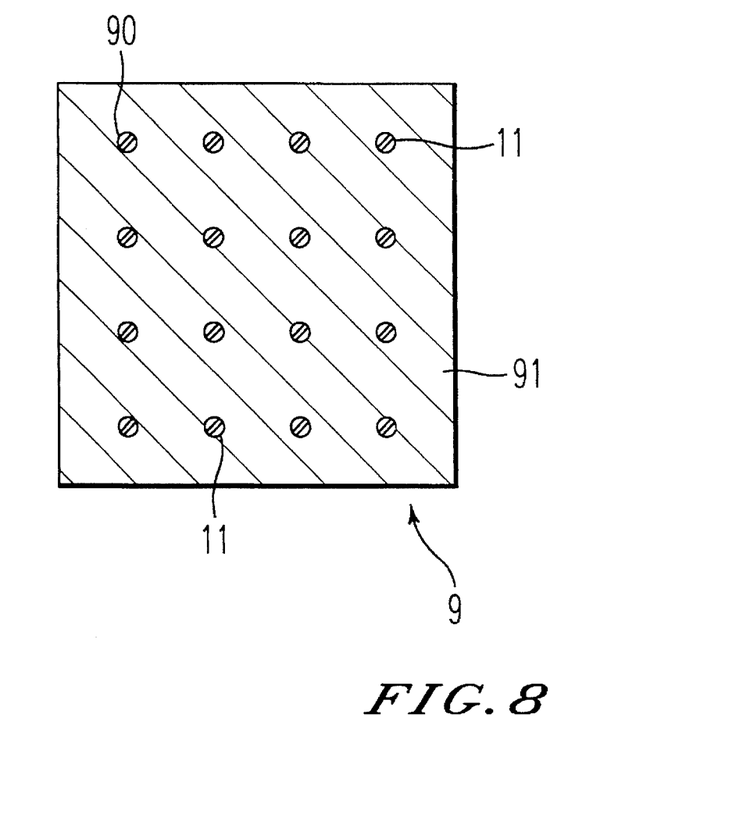
FIG. 8 is a cross-sectional view taken along the arrows 31—31 of FIG. 7.
Figure 9:
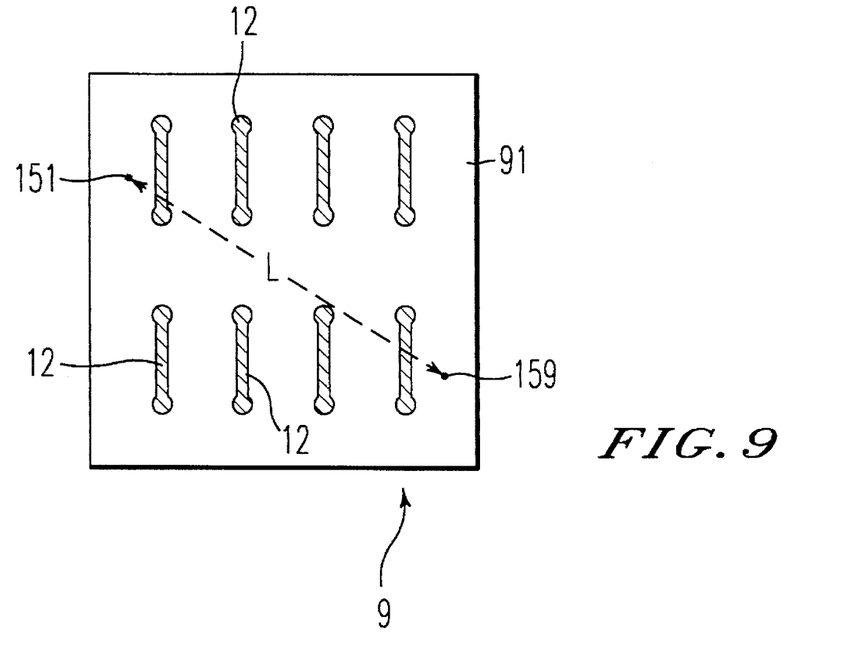
FIG. 9 is a plan view of the ceramic circuit substrate shown in FIG. 7.
Figure 10:
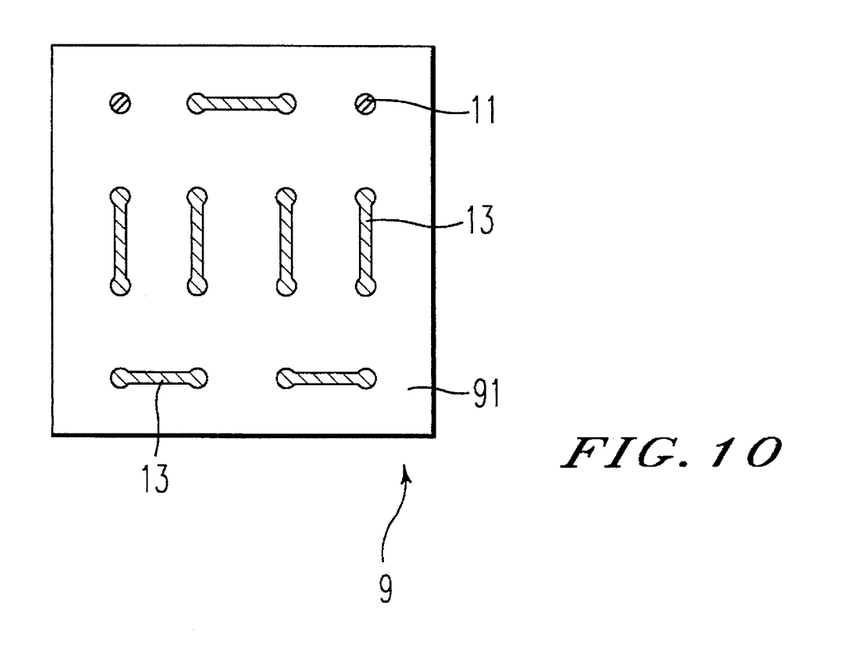
FIG. 10 is a cross-sectional view taken along the arrow 32—32 of FIG. 7.

In the ceramic substrate 9, the ceramic substrate 91 forms the uppermost layer, while the ceramic substrate 92 forms the lowermost layer. As shown in FIGS. 8–10, the conductive patterns 12 and 13 on the ceramic substrate 91 are electrically connected alternately via hole conductors 11 which fill the via holes 90.

A method of fabricating the above-described ceramic circuit substrate is described next.

Figures 11A, 11B:
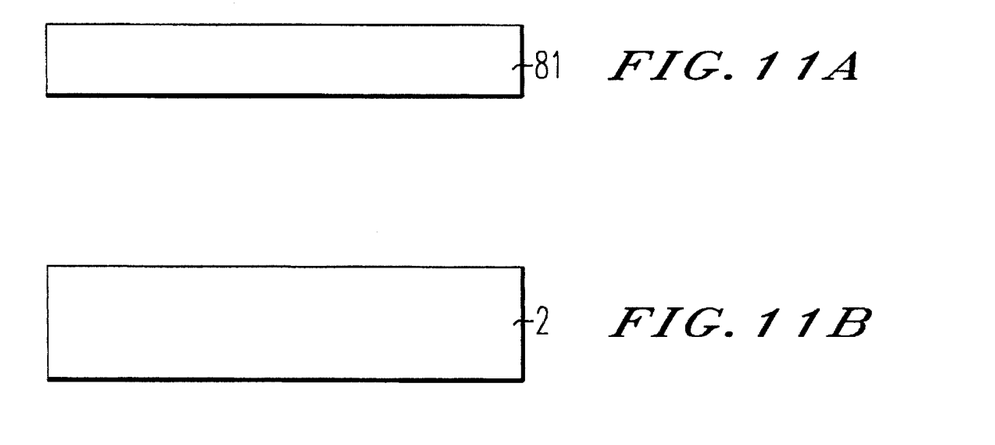
FIG. 11 illustrates steps successively performed to fabricate a ceramic circuit substrate of any one of Examples 5–8.
Figure 11C:
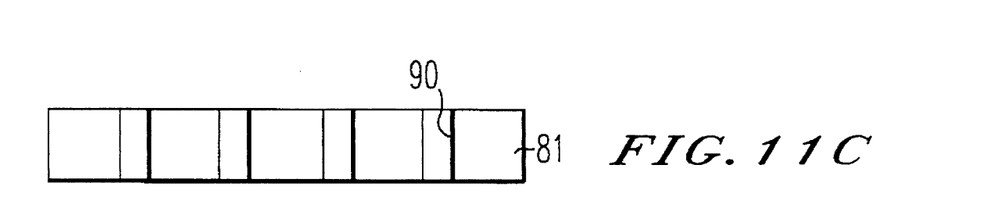
Figure 11D:
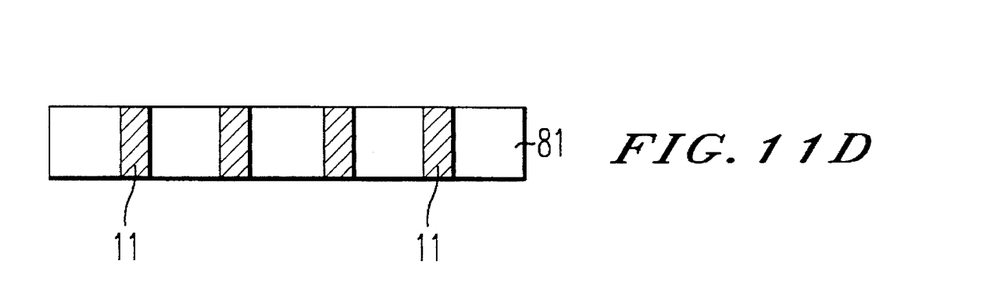
Figure 11E:
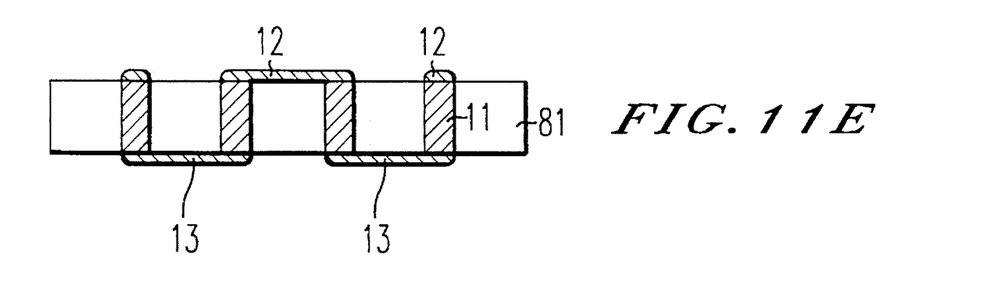

In step A, a ceramic greensheet 81 used for fabrication of the ceramic substrate 91 which is sinterable at 800°–1000° C. is prepared, as shown in FIG. 11(A).

The ceramic greensheet is prepared by mixing a powdered ceramic, an organic binder, and a solvent and shaping the mixture in the form of a sheet by a doctor blade. The thickness of the ceramic greensheet is 0.50 mm.

The above-described powdered ceramic consists of 60 parts by weight of a glass of the $CaO—Al_2O_3—SiO_2—B_2O_3$ system and 40 parts by weight of α-alumina. The average grain diameter of this powdered ceramic is 2 μm.

Butyral resin is used as the aforementioned binder. The solvent, described previously, can be toluene, ethanol, or dibutylphthalate.

In the next step B, as shown in FIG. 11(B), an unsintered ceramic sheet 2 having a thickness of 0.5 mm is prepared. This unsintered ceramic sheet is made of α-alumina that sinters at a temperature above 1000° C. The average grain diameter of the powdered α-alumina is 1 μm.

In step C, as shown in FIG. 11 (C1), via holes 90 having a diameter of 0.3 mm are formed in the ceramic greensheet 81, using dies. Then, as shown in FIG. 11 (C2), a via hole conductor 11 is filled into each of the via holes 90 by screen printing.

As shown in above-described Table 1, pastes 1–4 (examples 5–8) are used for via hole conductors 11.

The via hole conductors 11 take the form of paste and are obtained by mixing the mixed powders of the composition described above, ethylcellulose serving as a binder, and terpineol acting as a solvent. During the mixing process, the mixed powders are uniformly dispersed through the use of a three-roll mixer.

The grain diameters of the mixed powders are 0.1 to 20 μm. The average grain diameter is about 0.1 to 10 μm.

The mixed powders comprise a powdered Ag or a powdered mixture of Ag and Pd, along with powdered W or $Sb_2O_3$. The powdered mixture of Ag and Pd is a mixture of powdered Ag and powdered Pd.

In the next step D, as shown in FIG. 11 (D), conductive patterns 12 and 13 are printed on the upper and lower surfaces, respectively, of the ceramic greensheet 81.

The conductive pattern 12 is an outer pattern. As shown in Table 1, paste 7 is used for the outer pattern. The conductive pattern 13 is an inner layer pattern, and paste 6 is employed.

A ceramic greensheet 82 used for fabrication of the ceramic substrate 92 is formed in the same way as in the above-described step A. Then, the ceramic greensheet 81, processed by performing steps A–C, and the ceramic greensheet 82 formed in step A are punched with a die into a square form having outer dimensions measuring 120 mm by 120 mm.

Figure 12:
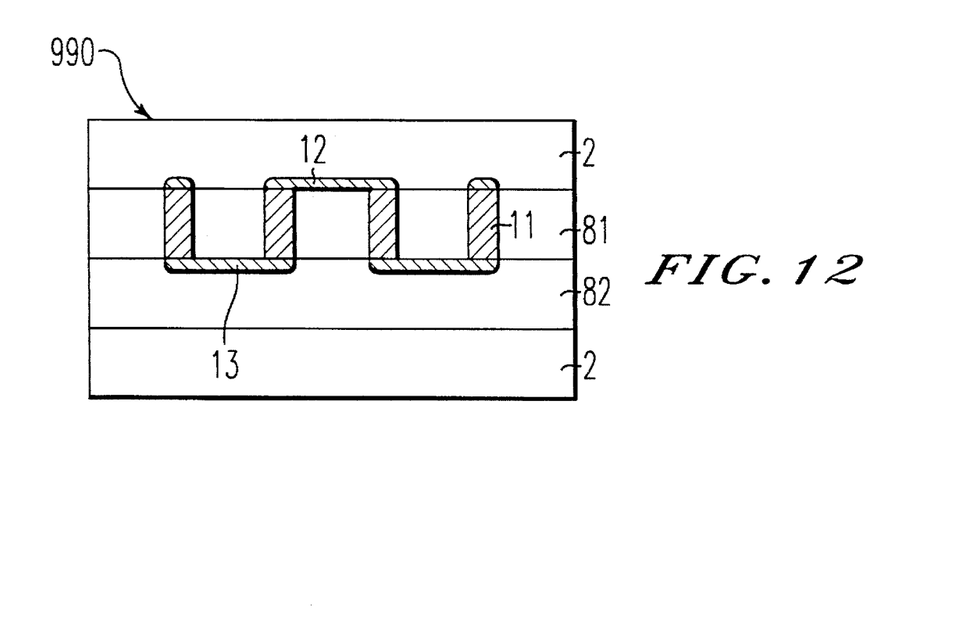
FIG. 12 is a cross-sectional view illustrating a step subsequent to the successive steps illustrated in FIG. 11.

In step E, as shown in FIG. 12(E), the ceramic greensheets 82 and 81 are stacked and laminated successively in this order, to prepare a laminated body. The above-described unsintered ceramic sheets 2 are placed on the uppermost and lowermost of the laminated body of ceramic greensheets 81 and 82. The laminated body and the unsintered ceramic sheets 2 are bonded together by thermocompression at a temperature of 100° C. and at a pressure of 100 Kg/cm² to form a compressed body 990.

Figure 13:
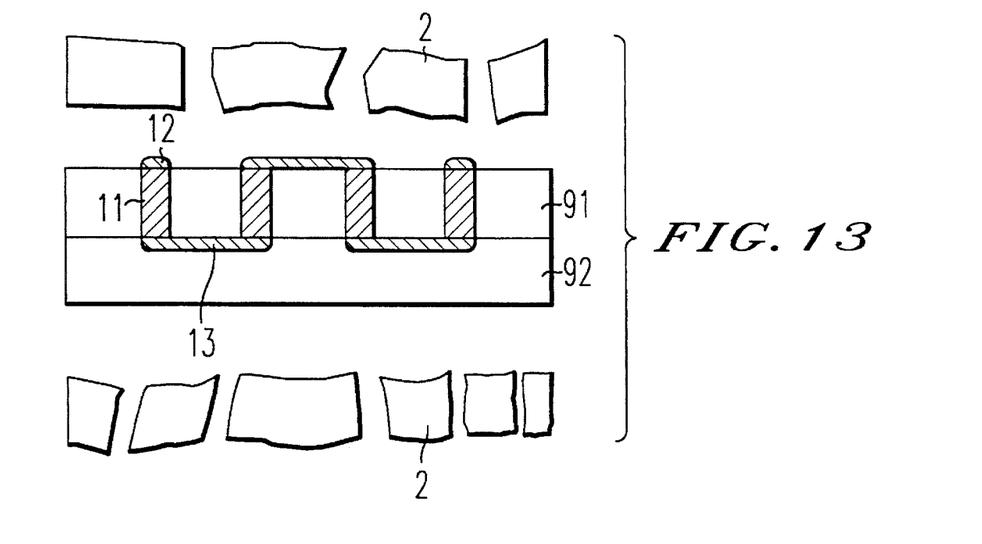
FIG. 13 is a cross-sectional view illustrating a step subsequent to the successive steps illustrated in FIG. 12.

In step F, as shown in FIG. 13 (F and G), the compressed body 990 is sintered at 900° C. for 20 minutes to sinter the ceramic greensheets.

Then, in step G, the unsintered ceramic sheets 2 are removed from the compressed body 990. Thus, the ceramic circuit substrate 9 as shown in FIG. 7 is obtained.

The dimensional stability of the ceramic circuit substrates as Samples 10–13 fabricated by the fabrication method of the present example and the electrical resistance of the via hole conductors in the via holes were evaluated.

Properties measured include the electrical resistance of the conductors, the shrinkage percentages of the ceramic substrates due to sintering, and their variations, as shown in Table 3. The paste Nos. 1 and 3–7 listed in above-described Table 1 were used in various Samples and comparative Samples. Electrical resistance of via holes is meant the total of the resistance of the via hole conductor and the connective resistance between the via hole conductor and the internal circuit. The resistance is measured by a resistance tester.

In measuring the shrinkage percentage, the distance L between patterns 151 and 159, formed on the surface of the ceramic substrate 91, was measured as shown in FIG. 9, the patterns 151 and 159 being used for measurement of the dimensions of the ceramic substrate.

The results are shown in Table 3. In this table, "variation" means the difference between the maximum value and the minimum value of the distance between the patterns 151 and 159.

As comparative Samples C1 and C2, ceramic circuit substrates using each of Pastes 6 and 7 as the via hole conductor 11 in the via holes were fabricated in the same way as in Samples 10–13, the Pastes 6 and 7 being used for formation of a conductive pattern on the inner and outer layer. These ceramic circuit substrates were taken as comparative Samples C1 and C2. In comparative Sample C3, the ceramic greensheets were sintered without sandwiching the ceramic greensheets between unsintered ceramic sheets. Comparative Sample C3 was similar to comparative Sample C1 in other respects.

Evaluations are made on ceramic circuit substrates of comparative Samples C1 and C2 described above, in the same way as the foregoing. The results are shown in Table 3.

For each individual test, 20 ceramic circuit substrates were fabricated and evaluated.

As can be seen from Table 3, the resistance of via hole conductors of Samples 10–13 of present invention were lower than those of Comparisons. (Compare 10, 12, 13 with C1, and 11 with C2).

In Samples 10–13 and comparative Samples C1 and C2, the shrinkage percentages of the ceramic substrates were 0.2%. The variations of the ceramic substrates were about 0.2 mm. Thus, it can be seen that in the present fabrication method, planar shrinkages of ceramic substrates were suppressed by holding ceramic greensheets between (unsintered ceramic sheets) and bonding them together by thermocompression to form a compressed body. On the other hand, in comparative Sample C3 the ceramic greensheets were not held between the unsintered ceramic sheets during sintering of the ceramic greensheets and so the shrinkage percentage of the ceramic substrates was 18.5%. The variation of the ceramic substrate was 1.4 mm.

As can be understood from the foregoing, the present ceramic circuit substrate has excellent electrical connectivity in the via holes, since the via hole conductors 11 of the composition described above are used.

TABLE 3

(Results of Evaluation)

|  | paste No. | via hole *resistance (MΩ/piece) | ceramic substrate | | |
|---|---|---|---|---|---|
|  |  |  | shrinkage percentage | distance (mm) | variation (mm) |
| sample 10 | 1 | 0.19 | 0.2(%) | 100 | 0.2 |
| sample 11 | 5 | 0.89 | 0.2(%) | 100 | 0.2 |
| sample 12 | 3 | 0.19 | 0.2(%) | 100 | 0.3 |
| sample 13 | 4 | 0.20 | 0.2(%) | 100 | 0.2 |
| comparative sample C1 | 6 | 0.23 | 0.2(%) | 100 | 0.2 |
| comparative sample C2 | 7 | 0.98 | 0.2(%) | 100 | 0.2 |
| comparative sample C3 | 6 | 0.36 | 18.5(%) | 82 | 1.4 |

*The resistance of a via hole is the resistance of the via hole conductor and the connective resistance between the internal layer circuit and the via hole conductor.

While the invention has been described with reference to example, it is to be understood that modifications or variations may be easily made by a person of ordinary skill in the art without departing from the scope of this invention which is defined by the appended claims.

What is claimed as new and desired to be secured by Letters Patent of the United States is:

1. A method of fabricating a ceramic circuit substrate, comprising the steps of:

preparing ceramic greensheets for the fabrication of the ceramic circuit substrate, and unsintered ceramic sheets unsinterable at a sintering temperature of said ceramic greensheet;

forming via holes which pass through a plurality of said ceramic greensheets and filling the via holes with via hole conductor paste;

printing conductive patterns on said ceramic greensheets;

stacking and laminating said ceramic greensheets so that said via hole conductors connect with the conductive patterns only at the upper and/or lower ends of each via hole conductor, and never at any side surfaces of each via hole conductor to prepare a laminated body;

placing said unsintered ceramic sheets on the uppermost layer and on the lowermost layer of said laminated body, bonding the layers together by thermocompression to prepare a compressed body;

firing said compressed body at the sintering temperature of the ceramic greensheets; and removing said unsintered ceramic sheets to prepare a ceramic circuit substrate, wherein said via hole conductors are only connected with the conductive patterns at the upper and/or lower ends of each via hole conductor, and never at any side surfaces of each via hole conductor.

2. The method of fabricating a ceramic circuit substrate according to claim 1, wherein said ceramic greensheets are sinterable at 800°–1000° C.

3. The method of fabricating a ceramic circuit substrate according to claim 1, wherein said via hole conductor and conductive patterns are made of a conductive material selected from the group consisting of Ag, Pd—Ag, Pt—Ag, Au, Cu.

4. The method of fabricating a ceramic circuit substrate according to claim 2, wherein the via hole conductor paste consists of a mixture of 100 parts by weight of Ag and 0.5 to 5 parts by weight in total of one or both of W and $Sb_2O_3$.

5. The method of fabricating a ceramic circuit substrate according to claim 2, wherein said via hole conductor paste consists of a mixture of 100 parts by weight of Ag and 0.5 to 5 parts by weight in total of one or both of W and $Sb_2O_3$ and 0.1 to 50 parts by weight of Pd.

6. The method of fabricating a ceramic circuit substrate according to claim 5, wherein the Ag and Pd, as via hole conductor paste, are selected from the group consisting of a mixture of powdered Ag and powdered Pd, a co-precipitant of Ag and Pd, and a powdered alloy of Ag and Pd.

7. The method of fabricating a ceramic circuit substrate according to claim 1, wherein the ceramic greensheets are fabricated by mixing a ceramic powder, an organic binder, and a solvent, and then shaping this mixture into greensheets.

8. The method of fabricating a ceramic circuit substrate according to claim 7, wherein the ceramic powder is selected from the group consisting of a mixture of a glass of the $CaO$—$Al_2O_3$—$SiO_2$—$B_2O_3$ system and $\alpha$-$Al_2O_3$, a mixture of a glass of the $PbO$—$SiO_2$—$B_2O_3$ system and $\alpha$-$Al_2O_3$ or mullite, and a crystallized glass of the $MgO$—$Al_2O_3$—$SiO_2$—$B_2)_3$ system.

9. The method of fabricating a ceramic circuit substrate according to claim 1, wherein the unsintered ceramic sheets are made of alumina, mullite, or zirconia.

10. The method of fabricating a ceramic circuit substrate according to claim 9, wherein the unsintered ceramic sheets are fabricated by mixing an organic binder, a solvent, and a powder selected from the group consisting of $\alpha$-$Al_2O_3$, mullite, and zirconia, and then shaping the mixture into sheets.

* * * * *